(12) United States Patent
Zhao et al.

(10) Patent No.: US 8,213,180 B2
(45) Date of Patent: Jul. 3, 2012

(54) ELECTROMAGNETIC INTERFERENCE SHIELD WITH INTEGRATED HEAT SINK

(75) Inventors: Sam Ziqun Zhao, Irvine, CA (US); Calvin Wong, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 87 days.

(21) Appl. No.: 12/827,354

(22) Filed: Jun. 30, 2010

(65) Prior Publication Data
US 2011/0176279 A1 Jul. 21, 2011

Related U.S. Application Data

(60) Provisional application No. 61/297,193, filed on Jan. 21, 2010.

(51) Int. Cl.
*H05K 7/20* (2006.01)

(52) U.S. Cl. .............. 361/720; 361/679.46; 361/679.54; 361/704; 361/719; 361/800; 361/816; 361/818; 165/80.3; 165/104.33; 165/185; 174/16.3; 174/252; 257/718; 257/719; 257/727

(58) Field of Classification Search ........... 361/679.46–679.54, 704–712, 361/714, 800, 801, 802, 816, 818, 715–724, 361/732, 760–767; 257/706–727, 659, 796, 257/798, 668, 698, 690; 165/80.3, 104.33, 165/185; 174/15.1, 16.3, 252, 35 R, 35 GC; 438/106–123
See application file for complete search history.

(56) References Cited

U.S. PATENT DOCUMENTS

| | | | | | |
|---|---|---|---|---|---|
| 5,175,395 | A | * | 12/1992 | Moore | 174/372 |
| 5,241,453 | A | * | 8/1993 | Bright et al. | 361/704 |
| 5,311,402 | A | * | 5/1994 | Kobayashi et al. | 361/760 |
| 5,357,404 | A | * | 10/1994 | Bright et al. | 361/818 |
| 5,541,811 | A | * | 7/1996 | Henningsson et al. | 361/704 |
| 5,566,052 | A | * | 10/1996 | Hughes | 361/704 |
| 5,717,248 | A | * | 2/1998 | Neumann et al. | 257/718 |
| 6,166,918 | A | * | 12/2000 | Olofsson et al. | 361/800 |
| 6,310,773 | B1 | * | 10/2001 | Yusuf et al. | 361/704 |
| 6,445,583 | B1 | * | 9/2002 | Kline et al. | 361/704 |
| 6,507,101 | B1 | * | 1/2003 | Morris | 257/706 |
| 6,784,540 | B2 | * | 8/2004 | Cardwell | 257/722 |
| 6,936,919 | B2 | * | 8/2005 | Chuang et al. | 257/717 |
| 7,061,773 | B2 | * | 6/2006 | Chen | 361/816 |
| 7,115,817 | B2 | * | 10/2006 | Stewart et al. | 174/252 |
| 7,232,332 | B2 | * | 6/2007 | Osborn et al. | 439/487 |
| 7,254,032 | B1 | * | 8/2007 | Xue et al. | 361/719 |
| 7,575,956 | B2 | * | 8/2009 | Ararao et al. | 438/123 |
| 7,589,968 | B1 | * | 9/2009 | Oliver | 361/704 |
| 7,623,360 | B2 | * | 11/2009 | English et al. | 361/816 |
| 7,787,252 | B2 | * | 8/2010 | Mertol | 361/719 |
| 2004/0052064 | A1 | * | 3/2004 | Oliver et al. | 361/816 |

* cited by examiner

*Primary Examiner* — Michail V Datskovskiy
(74) *Attorney, Agent, or Firm* — Fiala & Weaver P.L.L.C.

(57) ABSTRACT

A printed circuit board (PCB) assembly is provided that includes a PCB, an integrated circuit package, an electromagnetic interference (EMI) shield ring, and a heat sink lid. A first surface of the package is mounted to a first surface of the PCB. The EMI shield ring is mounted to the first surface of the PCB in a ring around the package. A first surface of the heat sink lid includes a recessed region and first and second supporting portions separated by the recessed region. The heat sink lid is mated with the EMI shield ring such that the package is positioned in an enclosure formed by the EMI shield ring and the recessed region of the heat sink lid. A second surface of the package may interface with a surface of the recessed region.

19 Claims, 16 Drawing Sheets

| Body (mm) | Pd (W) | Theta JA (Estimated) | Heat Sink type, size (mm) | Die Temp (°C) | Pd_max at Tj = 125 °C (W) |
|---|---|---|---|---|---|
| 14 x 14 | 3.66 | 24.83 | EMI Shield with gap pad | 145.89 | 2.82 |
| 15 x 15 | 3.66 | 23.64 | EMI Shield with gap pad | 141.52 | 2.96 |
| 17 x 17 | 3.66 | 22.83 | EMI Shield with gap pad | 138.57 | 3.07 |
| 19 x 19 | 3.66 | 22.03 | EMI Shield with gap pad | 135.62 | 3.18 |

| Body (mm) | Pd (W) | Theta JA (Estimated) | Heat Sink type, size (mm) | Die Temp (°C) | Pd_max at Tj = 125 °C (W) |
|---|---|---|---|---|---|
| 14 x 14 | 3.66 | 22.74 | EMI Shield with gap pad + 30x30x5mm external heat sink | 138.24 | 3.08 |
| 15 x 15 | 3.66 | 21.65 | EMI Shield with gap pad + 30x30x5mm external heat sink | 134.23 | 3.23 |
| 17 x 17 | 3.66 | 20.91 | EMI Shield with gap pad + 30x30x5mm external heat sink | 131.53 | 3.35 |
| 19 x 19 | 3.66 | 20.17 | EMI Shield with gap pad + 30x30x5mm external heat sink | 128.83 | 3.47 |

800

| Body (mm) | Pd (W) | Theta JA (Estimated) | Heat Sink type, size (mm) | Die Temp (°C) | Pd_max at Tj = 125 °C (W) |
|---|---|---|---|---|---|
| 14 X 14 | 3.66 | 20.13 | Heat sink / heat shield hybrid, 30x30mm, 2mm thickness with 3mm fins | 128.67 | 3.48 |
| 15 X 15 | 3.66 | 19.16 | Heat sink / heat shield hybrid, 30x30mm, 2mm thickness with 3mm fins | 125.13 | 3.65 |
| 17 x 17 | 3.66 | 18.51 | Heat sink / heat shield hybrid, 30x30mm, 2mm thickness with 3mm fins | 122.74 | 3.78 |
| 19 X 19 | 3.66 | 17.85 | Heat sink / heat shield hybrid, 30x30mm, 2mm thickness with 3mm fins | 120.35 | 3.92 |

| Body (mm) | Pd (W) | Theta JA (Estimated) | Heat Sink type, size (mm) | Die Temp (°C) | Pd_max at Tj = 125 °C (W) |
|---|---|---|---|---|---|
| 14 X 14 | 3.66 | 18.30 | Heat sink / heat shield hybrid, 40x40mm, 2mm thickness with 3mm fins | 121.97 | 3.83 |
| 15 X 15 | 3.66 | 17.42 | Heat sink / heat shield hybrid, 40x40mm, 2mm thickness with 3mm fins | 118.75 | 4.02 |
| 17 x 17 | 3.66 | 16.82 | Heat sink / heat shield hybrid, 40x40mm, 2mm thickness with 3mm fins | 116.58 | 4.16 |
| 19 X 19 | 3.66 | 16.23 | Heat sink / heat shield hybrid, 40x40mm, 2mm thickness with 3mm fins | 114.41 | 4.31 |

FIG. 9

ELECTROMAGNETIC INTERFERENCE SHIELD WITH INTEGRATED HEAT SINK

This application claims the benefit of U.S. Provisional Application No. 61/297,193, filed on Jan. 21, 2010, which is incorporated by reference herein in its entirety.

BACKGROUND OF THE INVENTION

1. Field of the Invention

The present invention relates to integrated circuit packaging technology.

2. Background Art

A printed circuit board (PCB), also referred to as printed wiring board (PWB), is used to mechanically support and electrically connect electronic components mounted to the PCB. A PCB includes a stack of conductive and non-conductive layers attached together (e.g., laminated together). Conductive pathways (e.g., traces) are formed in the conductive layers (e.g., by etching) that are used to electrically connect the mounted electronic components.

Examples of electronic components that may be mounted to PCBs are integrated circuit (IC) packages. IC packages typically include one or more chips/dies (e.g., from semiconductor wafers), and are used to environmentally protect the dies and to interface the dies to PCBs. IC packages may be configured in various ways to be mounted to a PCB, including having arrangements of pins, pads, solder balls, etc., that are used to mechanically secure the IC package to the PCB, as well as to electrically connect signals of the IC package to the PCB.

Many types of IC packages exist. One such type of IC package is a ball grid array (BGA) package. A BGA package has an array of solder ball pads located on a bottom external surface of a package substrate. Solder balls are attached to the solder ball pads. The solder balls are reflowed to attach the package to the PCB. In some BGA packages, a die is attached to the substrate of the package (e.g., using an adhesive), and signals of the die are interfaced with electrical features (e.g., bond fingers) of the substrate using wire bonds. In such a BGA package, wire bonds are connected between signal pads/terminals of the die and electrical features of the substrate. In another type of BGA package, which may be referred to as a "flip chip package," a die is attached to the substrate of the package in a "flip chip" orientation. In such a BGA package, solder bumps may be formed on the signal pads/terminals of the die, and the die is inverted ("flipped") and attached to the substrate by reflowing the solder bumps so that they attach to corresponding pads on the surface of the substrate.

Another example type of IC package is a quad flat package (QFP). A QFP is a four sided package that has leads extending from all four lateral sides. The leads are used to interface the QFP with a circuit board when the QFP is attached to the circuit board during a surface mount process. A type of IC package that is similar to the QFP is a quad flat no lead (QFN) package. Similarly to a QFP, a QFN package has four sides, but does not have leads that extend outward from the sides of the package. Instead, a bottom surface of the QFN package has contacts/lands that may be referred to as "pins." The contact pins interface the QFN package with a circuit board when the QFN is attached to the circuit board during a surface mount process.

The dies in IC packages typically generate a great amount of heat during operation. Thus, IC packages are frequently configured to disperse the generated heat so that their operation is not adversely affected by the generated heat. For example, an external heat sink may be attached to an IC package to disperse heat. External heat sinks are effective solutions to improving the thermal performance of a package. However, in many cases, the package geometry creates additional complexities in the mounting of such heat sinks.

Furthermore, during operation, some ICs emit electromagnetic radiation and/or are sensitive to received electromagnetic radiation. As such, some IC packages need electromagnetic interference (EMI) shielding. In such cases, a metal EMI shield may be used in an electronics system to provide EMI shielding for the resident IC package. Such an EMI shield needs to substantially surround the IC package to provide effective EMI shielding. As such, a typical EMI shield forms a metal box that encloses the IC package.

Conventional electronics system designs that require both heat sink and EMI shielding have problems with cost and efficiency. In one example, an external heat sink is mounted underneath the EMI shield such that the EMI shield will enclose the external heat sink. From a thermal perspective this may be an acceptable solution, but from a cost and design perspective it is grossly inefficient because the EMI shield dimensions would have to be enlarged excessively to fit an adequately-sized heat sink underneath. Another existing solution is to directly embed a large heat spreader into an electronic product enclosure. In this solution, the EMI shield is attached to a larger heat spreader that has been integrated into the enclosure using some form of thermal interface material, creating a thermal path for the heat to dissipate. This has the advantage of maintaining a small EMI shield size, but requires a larger and costlier heat spreader that spans the entire area of the product chassis to dissipate heat. According to still another existing solution, the heat sink is mounted above the EMI shield. This solution does not add cost other than a nominal-sized EMI shield and heat sink, but proves to be an ineffective thermal solution because of the several thermally resistive interfaces that heat has to travel through before being received by the heat sink.

BRIEF SUMMARY OF THE INVENTION

Methods, systems, and apparatuses are described for EMI shields and heat sink lids for IC packages substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 8 and 9 show tables that provide example size and performance data for the printed circuit board assembly of FIG. 5, according to example embodiments.

Figures 1, 2:
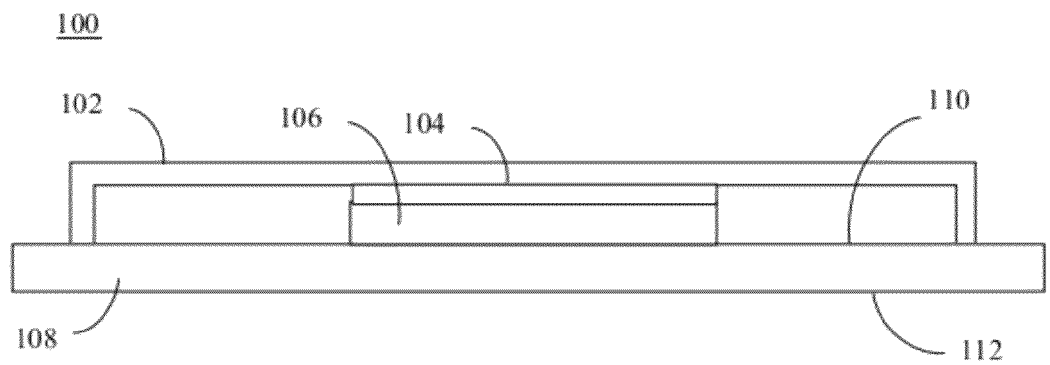
FIG. 1 shows a side cross-sectional view of a printed circuit board assembly with EMI shield can.
FIG. 2 shows a table providing example size and performance data for the printed circuit board assembly of FIG. 1.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example EMI Shield Ring and Heat Sink Lid Embodiments

As described above, some electronic devices may be configured with a mechanical enclosure/shield that surrounds the electronic device to prevent tampering and to provide EMI shielding. For instance, the EMI shielding may protect the electronic device from receiving electromagnetic radiation and/or may block emitted electromagnetic radiation from the electronic device. However, the presence of the enclosure limits the thermal solutions that are available for such devices because an external heat sink cannot be mounted without (1) substantially increasing the height and cost of the shield by mounting the heat sink under the shield, or (2) substantially decreasing the efficiency of the heat sink by mounting the heat sink above the shield. With the continuous increase of power density in electronic components, there exists serious thermal challenges that are not solely addressed by IC package selection and design.

For example, FIG. 1 shows a cross-sectional side view of printed circuit board assembly 100. As shown in FIG. 1, PCB assembly 100 includes an IC package 106, a PCB 108, an EMI shield can 102, and an interface material 104. PCB assembly 100 may include further features that are not shown in FIG. 1 for ease of illustration. As shown in FIG. 1, a first surface of package 106 is mounted to a first surface 110 of PCB 108. PCB 108 has a second surface 112 that is opposed to first surface 110. Package 106 may include one or more integrated circuits. EMI shield can 102 is mounted to surface 110 of PCB 108 over package 106. EMI shield can 102 has a recessed shape to enclose package 106 from the top and lateral sides (surfaces that are perpendicular to the top and bottom surfaces) of package 106 on PCB 108. Interface material 104 interfaces a second surface of package 106 to the top inner surface of EMI shield can 102. EMI shield can 102 may be made from a metal, such as stainless steel (e.g., 0.007 inch thick), to provide EMI shielding for package 106.

FIG. 2 shows a table 200 providing example size and thermal performance data for PCB assembly 100 of FIG. 1 in a JEDEC (Joint Electron Devices Engineering Council) still-air environment with 55° C. ambient temperature. For instance, as indicated by table 200, in one example implementation of PCB assembly 100, for a size of 14 mm by 14 mm for package 106 (and where interface material 104 is a gap pad), a temperature of package 106 reaches 145.89 degrees C. (e.g., during operation of the circuits of package 106). While EMI shield can 102 may provide effective EMI shielding of package 106 in PCB assembly 100, EMI shield can 102 does not provide for efficient heat sinking for heat generated by package 106.

Figures 3, 4:
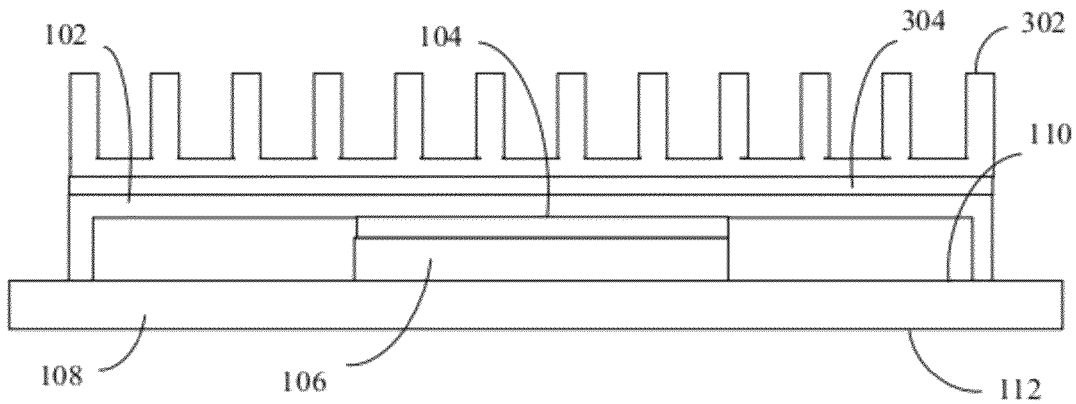
FIG. 3 shows a side cross-sectional view of a printed circuit board assembly with EMI shield can and heat sink.
FIG. 4 shows a table providing example size and performance data for the printed circuit board assembly of FIG. 3.

FIG. 3 shows a cross-sectional side view of a PCB assembly 300. PCB assembly 300 of FIG. 3 is similar to PCB assembly 100 of FIG. 1 with the addition of a finned heat sink 302 mounted to a top outer surface of EMI shield can 102. PCB assembly 300 may include further features that are not shown in FIG. 3 for ease of illustration. Heat sink 302 is mounted EMI shield can 102 by an interface material 304. Heat sink 302 may be aluminum, for example. Heat sink 302 is configured to aid in transferring heat from package 106, by enabling heat to transfer from package 106 through interface material 104, EMI shield can 102, interface material 304, and heat sink 302 into the ambient environment.

FIG. 4 shows a table 400 providing example size and performance data for PCB assembly 300 of FIG. 3 in a JEDEC still-air environment with 55° C. ambient temperature. For instance, as indicated by table 400, in one example implementation of PCB assembly 300, for a size of 14 mm by 14 mm for package 106 (and where heat sink 302 is a 30 mm by 30 mm by 5 mm heat sink), a temperature of package 106 reaches 138.24 degrees C. While EMI shield can 102 may provide effective EMI shielding, and heat sink 302 may provide better heat sinking than occurs in PCB assembly 100 of FIG. 1, heat is not efficiently transferred to heat sink 302 from package 106 due to the multiple interfaces between them (interface materials 104 and 304, and EMI shield can 102).

In embodiments, an alternative heat sink shield design is provided that serves as an effective EMI shield and an effective heat sink, while remaining efficient in cost and performance. In embodiments, an integrated circuit package may be enclosed on a PCB by an EMI shield ring capped with a heat sink lid. In such an embodiment, the EMI shield ring and heat sink lid combination provides effective EMI shielding and improved heat sinking.

Figure 5:
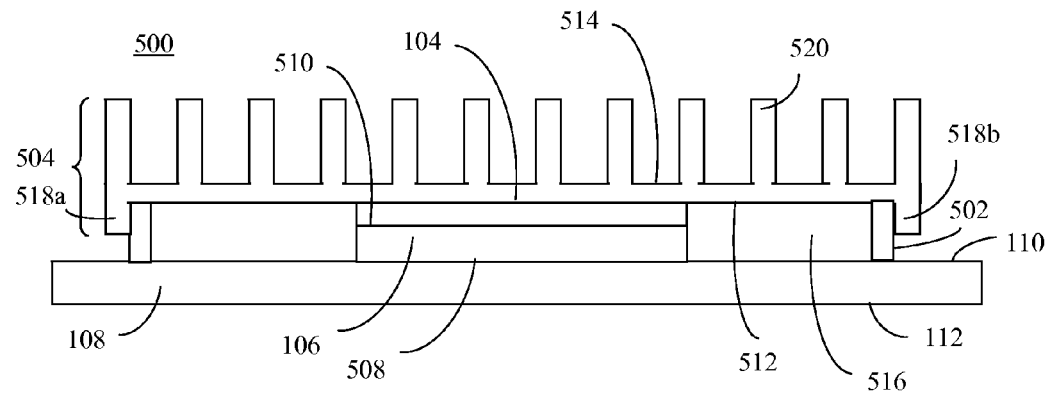
FIG. 5 shows a side cross-sectional view of a printed circuit board assembly, according to an example embodiment.

For instance, FIG. 5 shows a side cross-sectional view of a PCB assembly 500, according to an example embodiment. As shown in FIG. 5, PCB assembly 500 includes package 106, PCB 108, an EMI shield ring 502, a heat sink lid 504, and interface material 104. PCB assembly 500 may include further features (e.g., solder balls, pins, bond wires, substrate layers, additional electronic devices, etc.) that are not shown in FIG. 5 for ease of illustration. As shown in FIG. 5, a first surface 508 of package 106 is mounted to surface 110 of PCB 108 (e.g., by an adhesive material, solder balls or bumps, etc.). EMI shield ring 502 is mounted to first surface 110 of PCB 108. For example, EMI shield ring 502 may be mounted to PCB 108 using an interface material (not shown in FIG. 5), including any interface material mentioned elsewhere herein or otherwise known. EMI shield ring 502 has the shape of a ring to surround package 106 on PCB 108 on all sides of package 106. For instance, EMI shield ring 502 may be shaped as a rectangular ring, a circular ring, or other shape, to ring around package 106. EMI shield ring 502 may be made from stainless steel (e.g., 0.007 inch thick or other thickness) or other metal, including aluminum, copper, tin, nickel, or other metal, or a combination of metals/alloy.

Heat sink lid 504 has opposing first and second surfaces 512 and 514. First surface 512 of heat sink lid 504 includes a recessed region 516 and first and second supporting portions 518a and 518b that are separated by recessed region 516. A plurality of fins 520 extend from second surface 514 of heat sink lid 504. Any number of fins 520 that extend from second surface 514 (and/or from other regions of heat sink lid 504) may be present. Heat sink lid 504 may be made from any suitable heat sinking material such as a metal, including aluminum, copper, tin, nickel, or other metal, a combination of metals/alloy, ceramics, or composites. Heat sink lid 504 is configured to transfer heat from package 106 to the ambient environment. For example, fins 520 may be configured to enlarge a surface area of heat sink lid 504 to enhance such heat transfer.

Figure 6:
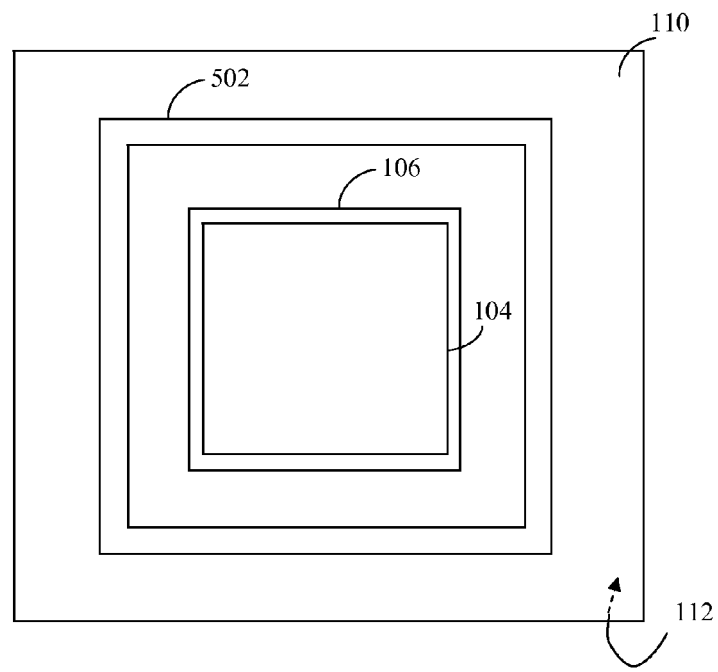
FIG. 6 shows a top view of the printed circuit board assembly of FIG. 5 with a heat sink lid not visible, according to an example embodiment.
Figure 7:
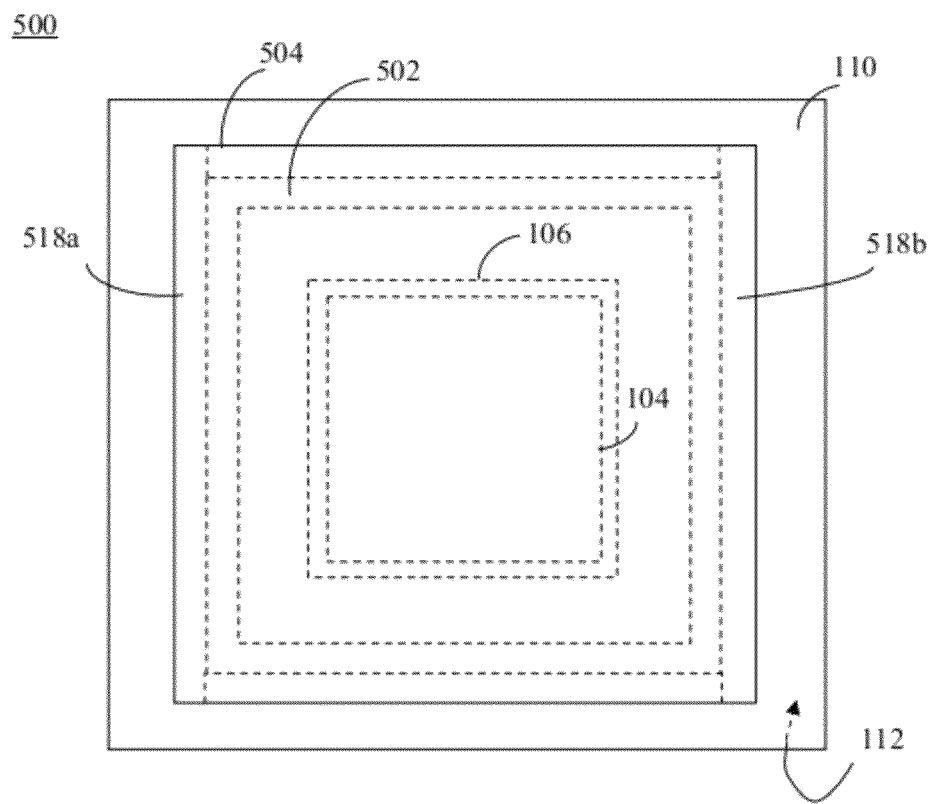
FIG. 7 shows a top view of the printed circuit board assembly of FIG. 5, according to an example embodiment.

As shown in FIG. 5, heat sink lid 504 is mated with EMI shield ring 502 such that package 106 is positioned in an enclosure formed by EMI shield ring 502 and heat sink lid 504 on PCB 108. For example, FIG. 6 shows a top view of PCB assembly 500 of FIG. 5 with heat sink lid 504 not present. As shown in FIG. 6, package 106 is mounted to surface 110, and is surrounded by EMI shield ring 502 (which is rectangular in shape in the example of FIG. 6). Interface material 104 is shown on package 106. FIG. 7 shows the top view of PCB assembly 500 of FIG. 5 with heat sink lid 504 mated to EMI shield ring 502, according to an example embodiment. Package 106, interface material 104, and EMI shield ring 502 are indicated by dotted line in FIG. 7 due to the obstructed view caused by heat sink lid 504. As shown in FIG. 7, first and second supporting regions 518a and 518b (indicated by dotted line) of heat sink lid 504 are positioned on opposing outer sides of EMI shield ring 502.

Figure 10:
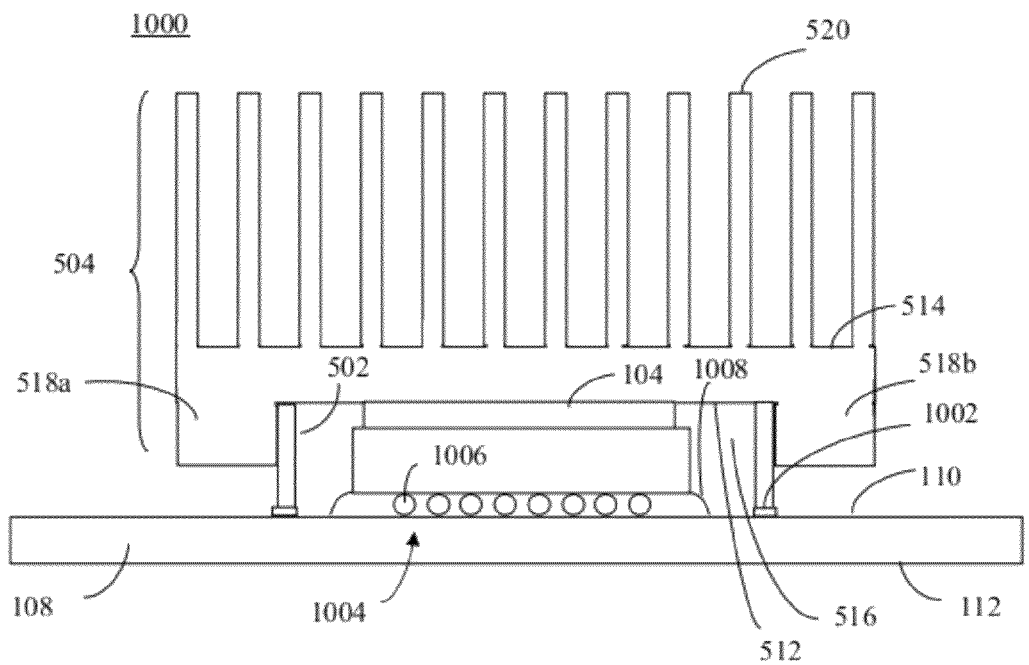
FIG. 10 shows a side cross-sectional view of an example printed circuit board assembly, according to an example embodiment.

Heat sink lid 504 and EMI shield ring 502 may be mated together in any suitable manner. As shown in the embodiment of FIGS. 8 and 10, heat sink lid 504 is fitted to EMI shield ring 502 such that an upper portion of EMI shield ring 502 fits between first and second supporting regions 518a and 518b of heat sink lid 504. In an alternative embodiment, first and second supporting regions 518a and 518b of heat sink lid 504 may fit within the ring of EMI shield ring 502. In an embodiment, an interface material may be used to attach heat ink lid 504 and EMI shield ring 502, including any interface material mentioned elsewhere herein or otherwise known. In another embodiment, as shown in FIG. 5, heat sink lid 504 and EMI shield ring 502 may be configured to conform tightly to each other such that friction between surfaces of first and second supporting regions 518a and 518b and EMI shield ring 502 holds heat sink lid 504 on EMI shield ring 502. In another embodiment, as described in further detail below, surfaces of heat sink lid 504 and EMI shield ring 502 may be configured to form an interlocking mechanism to mate heat sink lid 504 with EMI shield ring 502.

As shown in FIG. 5, second surface 510 of package 106 is proximate to (e.g., close or in contact with) first surface 512 of heat sink lid 504 in recessed region 516. Interface material 104 may be present between second surface 510 and first surface 512 to interface package 106 with heat sink lid 504 such that package 106 is coupled to heat sink lid 504 by interface material 104, and may be in contact with heat sink lid 504. In an embodiment, interface material 104 may be configured to be thermally conductive to enhance heat transfer from package 106 to heat sink lid 504. Additionally or alternatively, in an embodiment, interface material 104 may be an adhesive material that attaches second surface 510 of package 106 to first surface 512 in recessed region 516. Interface material 104 may be any suitable adhesive material, including any adhesive material mentioned elsewhere herein or otherwise known. For example, interface material 104 may be an epoxy such as a thermal epoxy (i.e., an epoxy configured for thermal conductivity), a thermal interface material, an electrically conductive adhesive material (e.g., including metal particle-filled epoxy, such as silver flakes filled epoxies, etc.) an electrically non-conductive material, or other type of adhesive material, conventionally available or proprietary. For example, in an embodiment, interface material 104 may be a gap pad made from a fiberglass-reinforced filler and polymer material, such as the Gap Pad 5000S35, developed by The Bergquist Company of Chanhassen, Minn. Interface materials used may have any suitable thickness.

FIGS. 8 and 9 show tables 800 and 900, respectively, providing example size and performance data for PCB assembly 500 in a JEDEC still-air environment with 55° C. ambient temperature, according to example embodiments. For instance, as indicated by table 800, in one example implementation of PCB assembly 500, for a size of 14 mm by 14 mm for package 106 (and where heat sink lid 504 is a 30 mm by 30 mm by 2 mm heat sink with 3 mm fins), a temperature of package 106 reaches 128.67 degrees C. As indicated by table 900, in another example implementation of PCB assembly 500, for a size of 14 mm by 14 mm for package 106 (and where heat sink lid 504 is a 40 mm by 40 mm by 2 mm heat sink with 3 mm fins), a temperature of package 106 reaches 121.97 degrees C. As such, a larger size for heat sink lid 504 may increase heat transfer from package 106, lowering a temperature of package 106. Furthermore, in comparison to similar configurations for packages 100 and 300 of FIGS. 4 and 6, PCB assembly 500 provides improved heat sinking because of the presence of heat sink lid 504 and due to the single interface (interface material 104) between package 106 and heat sink lid 504. Furthermore, EMI shield ring 502 and heat sink lid 504 provide EMI shielding for package 106.

A variety of package types may be configured similarly to PCB assembly 500 of FIG. 5 to provide heat sinking and EMI shielding. For instance, FIG. 10 shows a side cross-sectional view of an example PCB assembly 1000, according to an example embodiment. As shown in FIG. 10, PCB assembly 1000 is similar to PCB assembly 500 shown in FIG. 5, with a wafer-level IC package 1004 mounted to PCB 108 as an example of package 106. In FIG. 10, a bottom edge/surface of EMI shield ring 502 is attached to first surface 110 of PCB 108 by an adhesive material 1002. Package 1004 is mounted to first surface 110 by an array of solder bumps 1006. An underfill material 1008 is shown filling a space between solder bumps 1006, package 1004, and surface 110 of PCB 108. Heat sink lid 504 is mated with EMI shield ring 502 in a similar fashion as shown in FIG. 5. First supporting portion 518a, recessed region 516 in first surface 512 of heat sink lid 504, and second supporting portion 518b form a "bridge" shape over package 1004. Interface material 104 attaches package 1004 to surface 512 of heat sink lid 504 in recessed region 516. Heat sink lid 504 provides heat sinking for package 1004, and the combination of heat sink lid 504 and EMI shield ring 502 provide EMI shielding for package 1004.

Note that wafer-level IC package 1004 is shown in FIG. 10 to show an example of package 106 for purposes of illustration, and is not intended to be limiting. In other embodiments, package 106 may any other type of IC package, such as a BGA (ball grid array) package having wire bonds, a flip chip BGA package, a pin grid array (PGA) package, a quad flat package (QFP), a quad flat no lead (QFN) package, or other type of IC package.

Figure 11B:
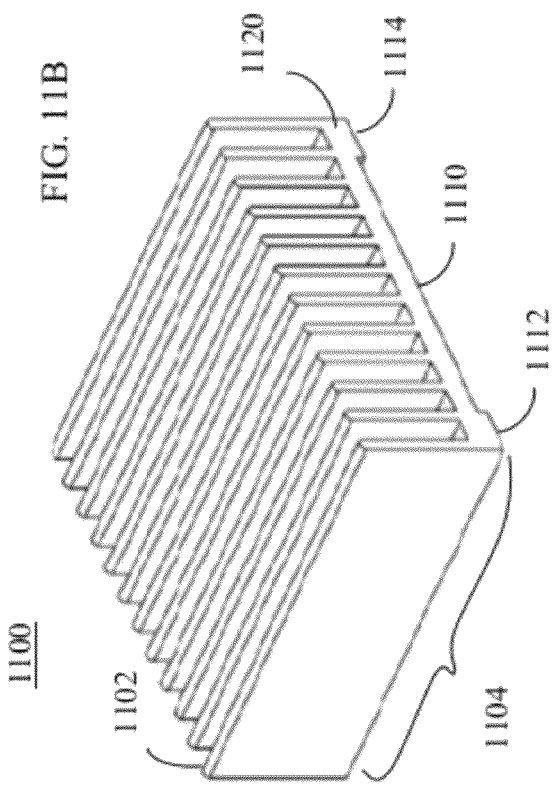
FIGS. 11A-11D show various views of a heat sink lid, according to an example embodiment.
Figure 11D:
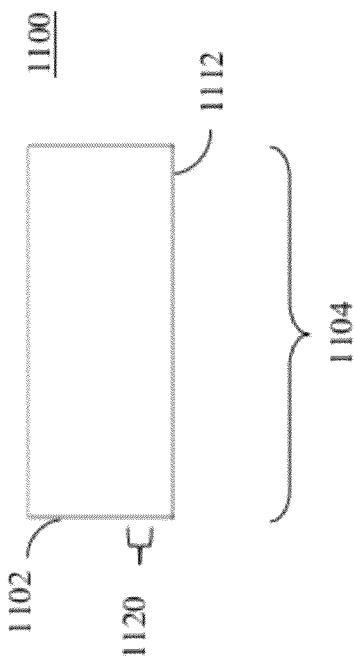
Figure 11A:
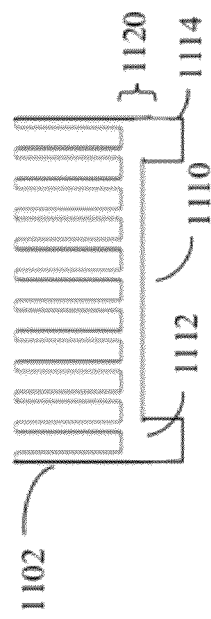
Figure 11C:
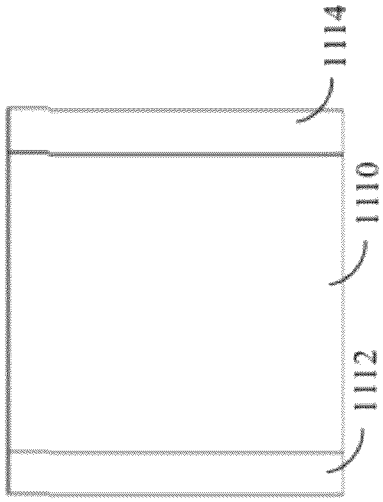

Heat sink lid 504 may be configured in various ways. For example, FIGS. 11A-11D show various views of a heat sink lid 1100, according to an example embodiment. Heat sink lid 1100 is an example of heat sink lid 504. As shown in FIGS. 11A-11D, heat sink lid 1100 includes a recessed region 1110 first and second supporting portions 1112 and 1114 in a first surface of heat sink lid 1100, and includes a plurality of fins 1102 extending from a second, opposing surface of heat sink lid 1100. FIG. 11A shows a side view of heat sink lid 1100, where fins 1102 are viewed edge-on. FIG. 11B shows a perspective view of heat sink lid 1100. FIG. 11C shows a bottom view of heat sink lid 1100. FIG. 11D shows a side view of heat sink lid 1100, including a side of a fin 1102 being shown. As shown in FIGS. 11A-11D, heat sink lid 1100 has a base plate portion 1120 having opposing first and second surfaces. Base plate portion 1120 has recessed region 1110 formed in the first surface between first and second supporting portions 1112 and 1114. The inner surface of recessed region 1110 may be in contact with a top surface of the die (e.g., directly or through an interface material). The second surface of base plate portion 1120 of heat sink lid 1100 has a plurality of fins 1102 extending therefrom. Any number of fins 1102 may be present. In the embodiment of FIG. 11, heat sink lid 1100, including base plate portion 1120 (including first and second supporting portions 1112 and 1114) and fins 1102, forms a single piece unit.

As shown in FIG. 11B, fins 1102, supporting portions 1112 and 1114, and recessed region 1110 of heat sink lid 1100 each have lengths that are equal to a length 1104 of heat sink lid 1100. In other embodiments, fins 1102, supporting portions 1112 and 1114, and/or recessed region 1110 may have lengths that are less than length 1104. For example, supporting portions 1112 and 1114 may each be separated into separate portions (e.g., posts). Furthermore, each of fins 1102 may be separated into multiple fins. Still further, in an embodiment, although two supporting portions 1112 and 1114 are shown on opposing sides of recessed region 1110, in another embodiment, a continuous supporting portion may rim recessed region 1110 on all four sides.

Figure 12:
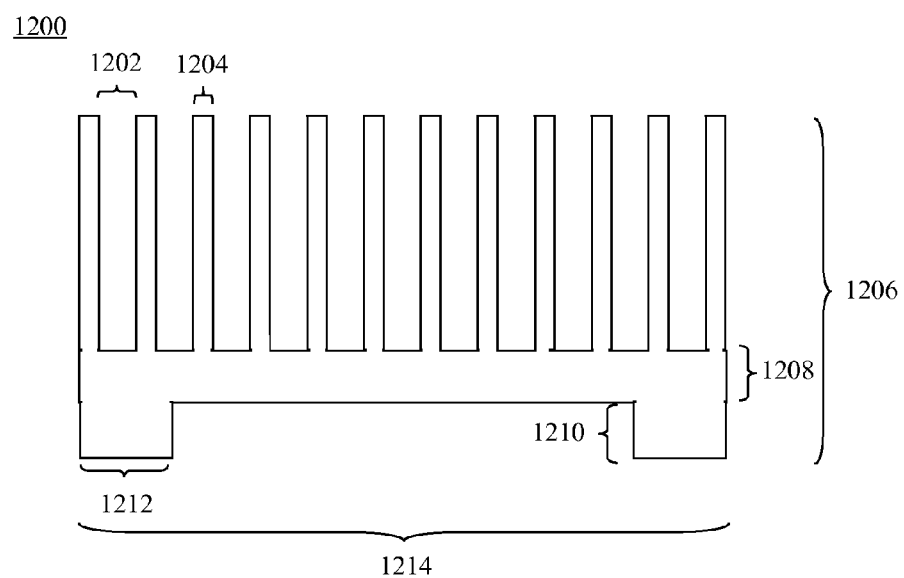
FIG. 12 shows a side view of an example heat sink lid, according to an embodiment.

FIG. 12 shows a side view of an example heat sink lid 1200, according to an embodiment. Heat sink lid 1200 is generally the same as heat sink lid 504 shown in FIG. 5. Several example dimensions for heat sink lid 1200 are indicated in FIG. 12. For instance, a fin spacing 1202, a fin thickness 1204, a heat sink height 1206, a base plate inner thickness 1208, a recessed region depth 1210, a supporting portion width, 1212 and a heat sink width 1214 are all indicated in FIG. 12. In one embodiment, these dimensions may have the following example values: fin spacing 1202 equal to 2.1 mm, fin thickness 1204 equal to 1.0 mm, heat sink height 1206 equal to 15.0 mm, base plate inner thickness 1208 equal to 2.5 mm, recessed region depth 1210 equal to 0.85 mm, supporting portion width 1212 equal to 4.0 mm, and heat sink width 1214 equal to 35.0 mm. These example dimensions for heat sink lid 1200 are provided for purposes of illustration and are not intended to be limiting. In alternative embodiments, these dimensions of heat sink lid 1200 may have other values.

The embodiments described herein provide advantages, including a low-cost and efficient thermal solution. There is little to no additional costs to the embodiment of FIG. 5 relative to conventional implementations, aside from the cost of heat sink lid 504 and EMI shield ring 502. The manufacturing and mounting procedures may be configured such that there are no additional steps which may introduce complications or increase costs.

Interlocking Heat Sink Lid and EMI Shield Ring Embodiments

Figure 13:
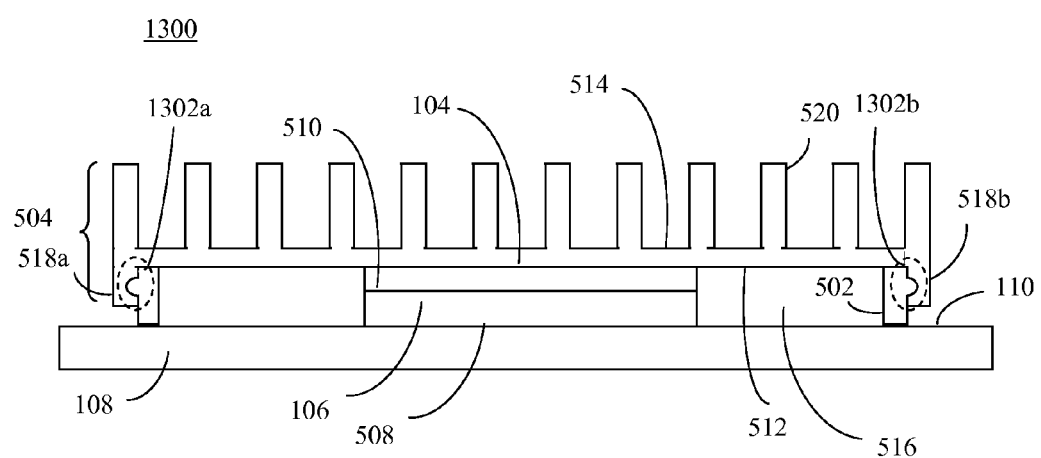
FIG. 13 shows a side cross-sectional view of a printed circuit board assembly, according to an example embodiment.

As described above, in embodiments, EMI shield ring 502 and heat sink lid 504 may have surfaces configured to interlock, to attach heat sink lid 504 to EMI shield ring 502. For instance, FIG. 13 shows a side cross-sectional view of an integrated circuit PCB assembly 1300, according to an example embodiment. PCB assembly 1300 is similar to PCB assembly 500 of FIG. 5, with differences described as follows. As shown in FIG. 13, EMI shield ring 502 is attached to first surface 110 of PCB 108. Package 106 is mounted to first surface 110 of PCB 108. Heat sink lid 504 is mated with EMI shield ring 502. Interface material 104 interfaces package 106 with surface 512 of heat sink lid 504 in recessed region 516.

In the embodiment of FIG. 13, mating of heat sink lid 504 to EMI shield ring 502 is enhanced by first and second interlocking mechanisms 1302a and 1302b (indicated by dotted line circles). First interlocking mechanism 1302a interlocks an inner surface of first supporting portion 518a (adjacent to recessed region 516) with a first outer side surface of EMI shield ring 502. Interlocking mechanism 1302b interlocks an inner surface of second supporting portion 518b with a second (opposing) outer side surface of EMI shield ring 502.

Figure 14:
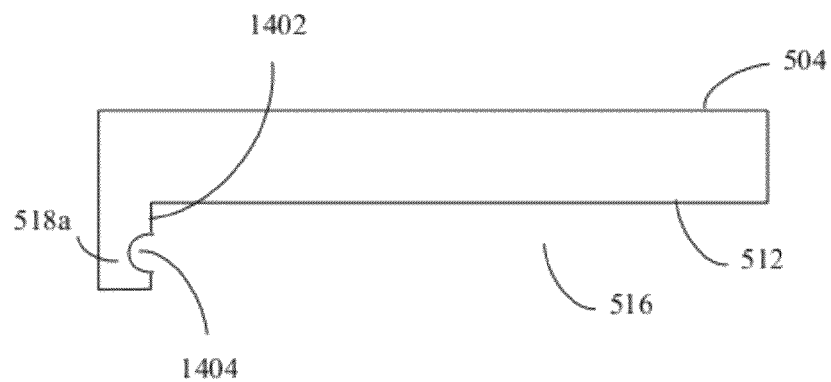
FIG. 14 shows a portion of a heat sink lid, according to an example embodiment.
Figure 15:
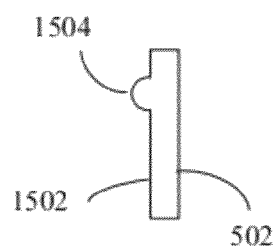
FIG. 15 shows a portion of an EMI shield ring, according to an example embodiment.
Figure 16:
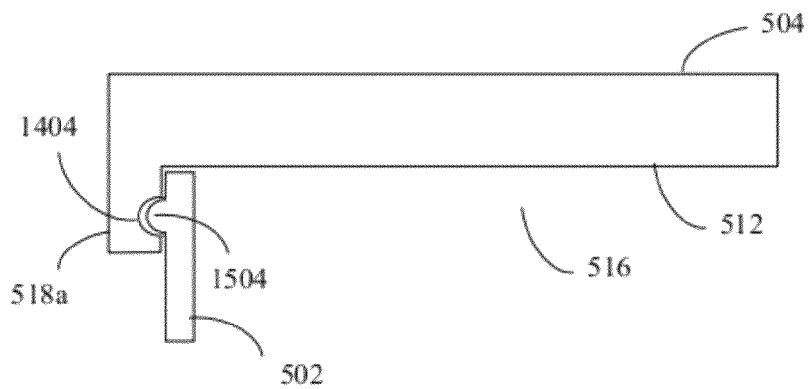
FIG. 16 shows the portions of the heat sink lid of FIG. 14 and EMI shield ring of FIG. 15 mated together, according to an example embodiment.

In the example FIG. 13, interlocking mechanisms 1302a and 1302b each include a protruding feature on the corresponding outer side surface of EMI shield ring 502 and an indented feature on the inner surface of the corresponding supporting portion 518. The protruding and indented features of interlocking mechanisms 1302a and 1302b may have various forms. For instance, FIG. 14 shows a portion of heat sink lid 504 of FIG. 5, according to an example embodiment. The portion of heat sink lid 504 shown in FIG. 14 includes first supporting portion 518a and a portion of recessed region 516. Furthermore, an inner surface 1402 of first supporting portion 518a in recessed region 516 includes an indented feature 1404. In the example of FIG. 14, indented feature 1404 is a rounded indentation (e.g., has a circular cross-section—a half circle). FIG. 15 shows a portion of EMI shield ring 502, according to an example embodiment. The portion of EMI shield ring 502 shown in FIG. 15 includes a side portion (e.g., the left side of EMI shield ring 502 in FIG. 5) of EMI shield ring 502. Furthermore, an outer surface of EMI shield ring 502 of FIG. 15 includes a protruding feature 1504. In the example of FIG. 15, protruding feature 1504 is a rounded protrusion (e.g., has a circular cross-section—a half circle). Indented feature 1404 of FIG. 14 and protruding feature 1504 of FIG. 15 are configured to interlock when EMI shield ring 502 and heat sink lid 504 are mated. For example, FIG. 16 shows the portions of heat sink lid 504 of FIG. 14 and EMI shield ring 502 of FIG. 15 when mated together. As shown in FIG. 16, indented feature 1404 interlocks with (e.g., receives) protruding feature 1504 to attach and secure heat sink lid 504 to EMI shield ring 502 (e.g., as shown in FIG. 13) (second supporting portion 518b of heat sink lid 504 and the opposing side portion of EMI shield ring 502, not visible in FIGS. 14-16, may be configured similarly and may interlock in a similar fashion).

Figure 17:
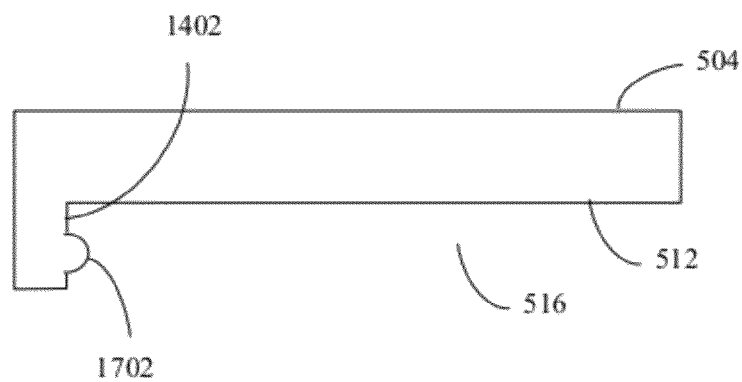
FIG. 17 shows a portion of a heat sink lid, according to an example embodiment.
Figure 18:
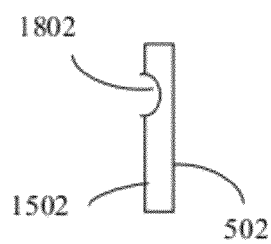
FIG. 18 shows a portion of an EMI shield ring, according to an example embodiment.
Figure 19:
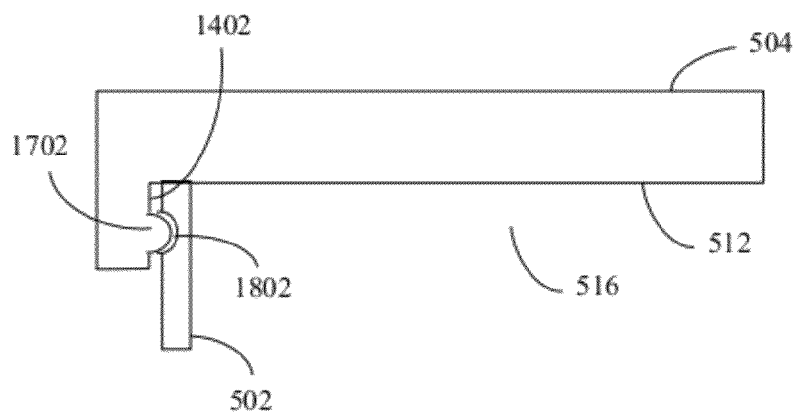
FIG. 19 shows the heat sink lid of FIG. 17 and the EMI shield ring of FIG. 18 mated together, according to an example embodiment.

It is noted that either of heat sink lid 504 or EMI shield ring 502 may include an indented feature, while the other of heat sink lid 504 or EMI shield ring 502 may include the corresponding protruding feature. For instance, FIG. 17 shows the portion of heat sink lid 504 shown in FIG. 14, where a protruding feature 1702 extends from surface 1402 (rather than an indented feature being present as in FIG. 14), according to an example embodiment. FIG. 18 shows the portion of EMI shield ring 502 shown in FIG. 15, where an indented feature 1802 is present in surface 1502 (rather than a protruding feature being present as in FIG. 15), according to an example embodiment. As shown in FIG. 19, protruding feature 1702 interlocks with (e.g., extends into) indented feature 1802 to attach and secure heat sink lid 504 to EMI shield ring 502.

Figure 20:
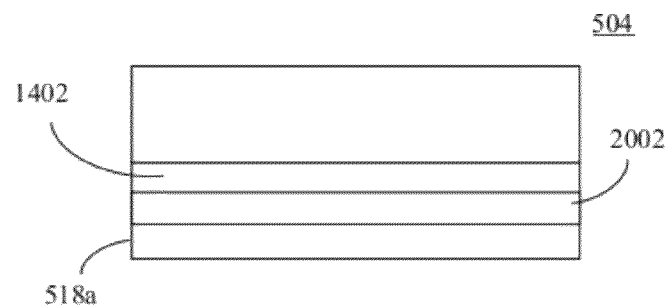
FIG. 20 shows a cross-sectional view of a heat sink lid, according to an example embodiment.
Figure 21:
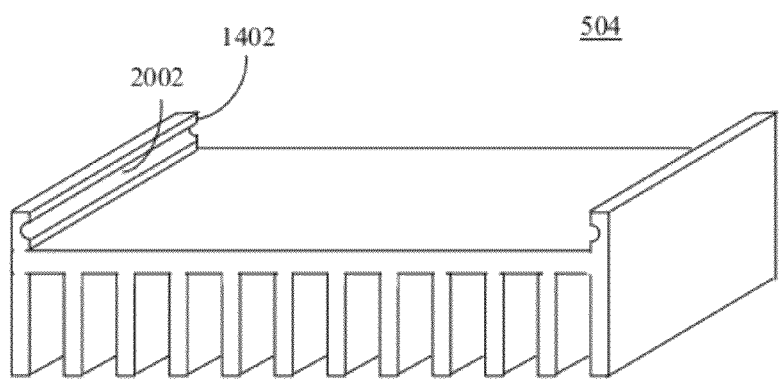
FIG. 21 shows a perspective view of the heat sink lid of FIG. 20, according to an example embodiment.

Such indented features and protruding features in EMI shield ring 502 and heat sink lid 504 may be configured in various ways. For instance, FIG. 20 shows a cross-sectional view of heat sink lid 504, according to an example embodiment. In FIG. 20, surface 1402 of first supporting portion 518a is shown. Furthermore, an indented feature 2002 is formed in surface 1402. FIG. 21 shows a perspective view of heat sink lid 504 of FIG. 20, according to an example embodiment. In the example of FIGS. 20 and 21, indented feature 2002 is a trench that extends across the length of surface 1402 of first supporting portion 518a (second supporting portion 518b may include a similar trench). Although the trench of indented feature 2002 is shown as having a circular or rounded cross-section, the trench may have other shapes, including a rectangular cross-section, a triangular cross-section, etc. Furthermore, in an alternative embodiment, the trench may extend across a portion of the length of surface 1402.

Figure 22:
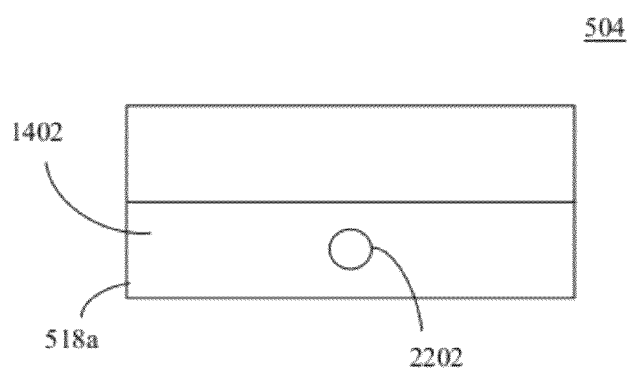
FIG. 22 shows a cross-sectional view of a heat sink lid, according to another example embodiment.

FIG. 22 shows a cross-sectional view of heat sink lid 504, according to another example embodiment. FIG. 22 provides a view of heat sink lid 504 similar to the view shown in FIG. 20, showing surface 1402 of first supporting portion 518a. Furthermore, an indented feature 2202 is formed in surface 1402. In the example of FIG. 22, indented feature 2002 is a circular dimple formed in surface 1402. Any number of such circular dimples (or elongated dimples) may be formed in surface 1402, as well as in the corresponding surface of second supporting portion 518b.

Figure 23:
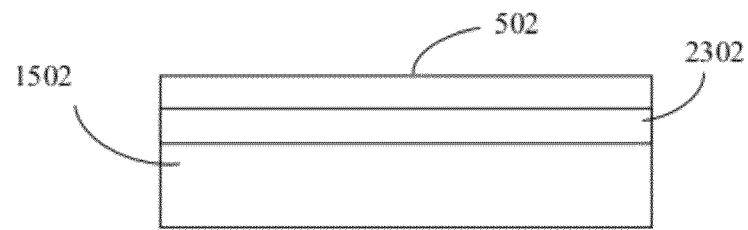
FIG. 23 shows a side view of an EMI shield ring, according to an example embodiment.
Figure 24:
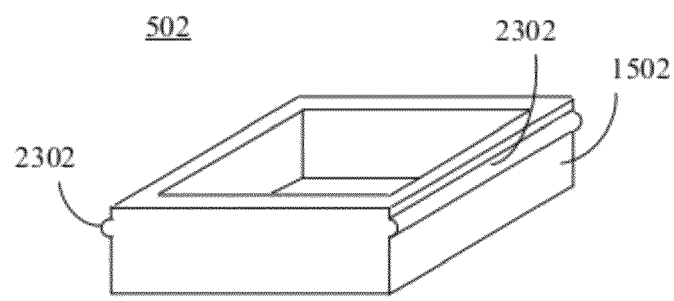
FIG. 24 shows a perspective view of the EMI shield ring of FIG. 23, according to an example embodiment.

Indented features 2002 and 2202 may have corresponding protruding features in EMI shield ring 502. Heat sink lid 504 is mounted to EMI shield cage 502 by mating protruding bumps or ridges of EMI shield cage 502 with indented features 2002 and/or 2202 of heat sink lid 504. For instance, FIG. 23 shows a side view of EMI shield ring 502, according to an example embodiment. In FIG. 23, surface 1502 of EMI shield ring 502 is shown. Furthermore, a protruding feature 2302 extends from surface 1502. FIG. 24 shows a perspective view of EMI shield ring 502 of FIG. 23, according to an example embodiment. In the example of FIGS. 23 and 24, protruding feature 2302 is a ridge that extends across the length of surface 1502 of EMI shield ring 502 (the opposing outer side of EMI shield ring 502 is shown including a similar ridge). Although the ridge of protruding feature 2302 is shown as having a circular or rounded cross-section, the ridge may have other shapes, including a rectangular cross-section, a triangular cross-section, etc. Furthermore, in an alternative embodiment, the ridge may extend across a portion of the length of surface 1502.

Figure 25:
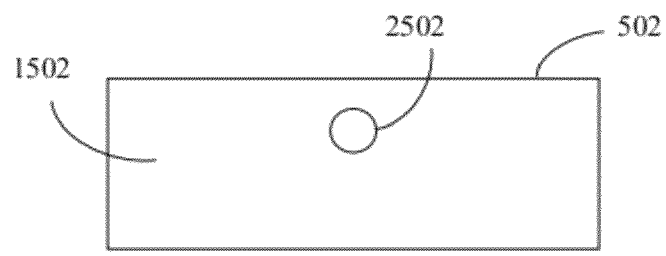
FIG. 25 shows a side view of an EMI shield ring, according to another example embodiment.

FIG. 25 shows a side view of EMI shield ring 502, according to another example embodiment. FIG. 25 provides a view of EMI shield ring 502 similar to the view shown in FIG. 23, showing surface 1502 of EMI shield ring 502. Furthermore, a protruding feature 2502 extends from surface 1502. In the example of FIG. 25, protruding feature 2502 is a circular bump formed in surface 1502. Any number of such circular bumps (or elongated bumps) may be formed in surface 1502, as well as in the corresponding opposing outer surface of EMI shield ring 502.

Figure 26:
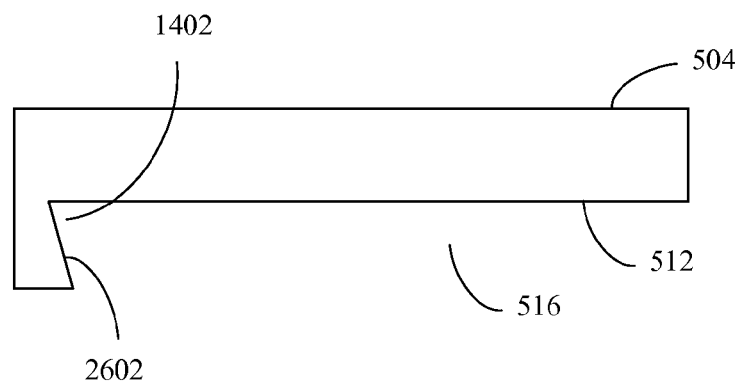
FIG. 26 shows the portion of a heat sink lid, according to an example embodiment.
Figure 27:
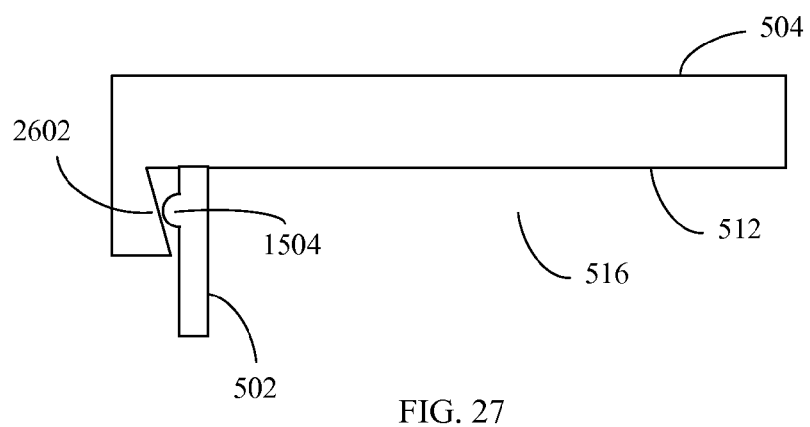
FIG. 27 shows the portion of heat sink lid of FIG. 26 interlocking with the portion of the EMI shield ring shown in FIG. 25, according to an example embodiment.

In another embodiment, FIG. 26 shows the portion of heat sink lid 504 shown in FIG. 14, where an indented feature 2602 is formed in surface 1402, according to an example embodiment. In the example of FIG. 26, indented feature 2602 has a triangular or slanted (surface 1402 and surface 512 forming an acute angle) cross-section. FIG. 27 shows the portion of heat sink lid 504 of FIG. 26 and the portion of EMI shield ring 502 shown in FIG. 15, where protruding feature 1504 interlocks with (e.g., extends into) indented feature 2602 to attach and secure heat sink lid 504 to EMI shield ring 502.

The examples of indented and protruding features shown in FIGS. 13-27 are provided for purposes of illustration, and are not intended to be limiting. Such indented and protruding features may have alternative shapes and/or sizes, and any number of one or more of which may be present in a surface of an EMI shield ring 502 and/or heat sink lid 504 to enable their interlocking.

Example Fabrication Embodiments

Figure 28:
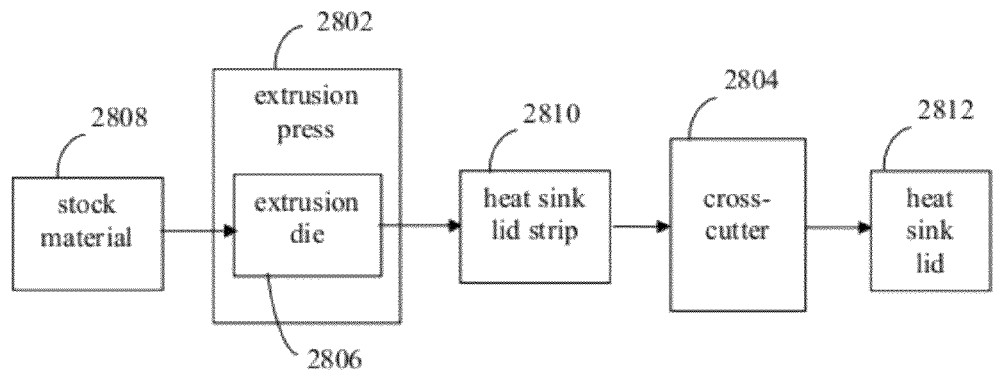
FIG. 28 shows a system for forming heat sinks, according to an example embodiment.

Heat sink lids may be formed in a variety of ways, according to embodiments. For example, FIG. 28 shows a block diagram of a system 2800 for forming heat sink lids having a "bridged" form. For instance, heat sink lid 504 of FIG. 5 may be formed according to system 2800. As shown in FIG. 28, system 2800 includes an extrusion press 2802 and a cross-cutter 2804. Furthermore, extrusion press 2802 includes an extrusion die 2806. System 2800 is described as follows with respect to a flowchart 2900 shown in FIG. 29. Flowchart 2900 provides a process for forming heat sink lids, according to an example embodiment. Flowchart 2900 is described as follows.

Figure 29:
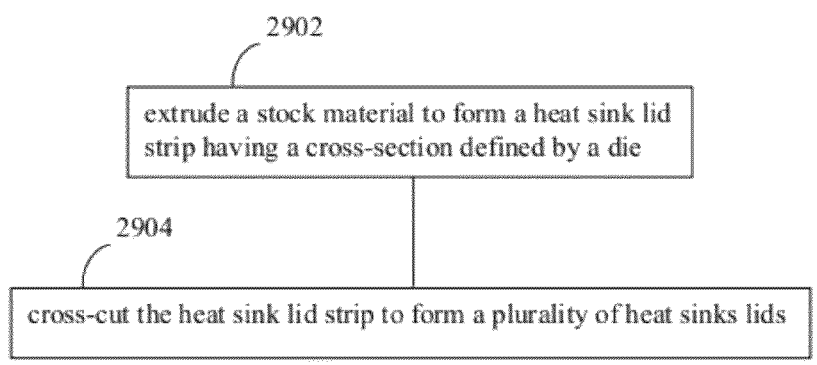
FIG. 29 shows a flowchart for a process for forming heat sinks, according to an example embodiment.

As shown in FIG. 29, flowchart 2900 begins with step 2902. In step 2902, a stock material is extruded to form a heat sink lid strip having a cross-section defined by a die. For example, with reference to FIG. 28, extrusion press 2802 receives a stock material 2808. Stock material 2808 may be any suitable material for heat sink lids, including a metal such as copper, aluminum, tin, nickel, gold, silver, or other metal, or a combination of metals/alloy, a ceramic material, a polymer, etc. Extrusion press 2802 includes a press, such as a hydraulic press, an electric press, an oil pressure-based press, or other type of press, configured to force stock material 2808 through die 2806. Stock material 2808 may be heated prior to being provided to extrusion press 2802, or may be extruded while cold. Stock material 2808 may have a rectangular cross-section, or other shape cross-section, when being applied to extrusion press 2802. In one configuration, a dummy block may be positioned behind stock material 2808, and extrusion press 2802 may include a ram that presses on the dummy block to force stock material 2808 through die 2806. Heat sink lid strip 2810 may be allowed to cool (if heated prior to being extruded).

Forcing stock material 2808 through die 2806 generates a heat sink lid strip 2810, which has a cross-section defined by die 2806. Thus, extrusion press 2802 may form features in heat sink lid strip 2810, such as fans (such as fans 520 shown in FIG. 5), one or more recesses (such as recessed region 516 shown in FIG. 5), one or more indented and/or protruding features (e.g., for interlocking), and/or further heat sink lid features. Examples of such further heat sink lid features are described elsewhere herein. Such features are formed along a length of heat sink lid strip 2810 by extrusion press 2802.

Figure 30:
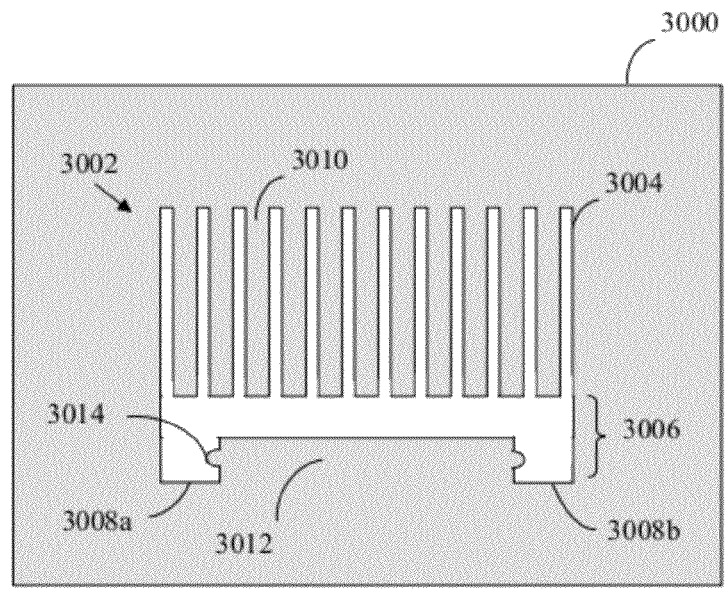
FIG. 30 shows an example extrusion die, according to an embodiment.

For instance, FIG. 30 shows an example extrusion die 3000, according to an embodiment. As shown in FIG. 30, die 3000 includes an opening 3002. Opening 3002 has an outline that defines the cross-sectional shape of a heat sink lid strip formed by passing a stock material through opening 3002 of die 3000. As shown in FIG. 30, opening 3002 has a plurality of parallel slots 3004 separated by narrow elongated die tabs 3010. Parallel slots 3004 correspond to fins 520 of FIG. 5. Each slot 3004 has an end that opens into a base plate opening region 3006. Base plate opening region 3006 corresponds to base plate portion 1208 (e.g., shown in FIG. 12). Base plate opening region 3006 is generally rectangular, with a rectangular recessed area formed by a relatively short widened tab 3012 that protrudes into base plate opening region 3006. First and second open regions 3008a and 3008b are formed on either side of widened tab 3012 that correspond to first and second supporting portions 518a and 518b of FIG. 5. Furthermore, a rounded tab 3014 may optionally protrude into first open region 3008a from tab 3012. When present, rounded tab 3014 corresponds to indented feature 1404 shown in FIG. 14. A similar rounded tab is also shown on the opposing side or tab 3014 that corresponds to a second indented feature 1404. Alternatively, a rounded recess or notch may be formed in tab 3012 in place of each rounded tab 3014 that corresponds to protruding feature 1702 (of FIG. 17). Tab 3014 or a notch, when present, may have any shape, including being rectangular, triangular, etc., to correspond to a desired corresponding indented feature or protruding feature to be formed in a heat sink lid.

In step 2904, the heat sink lid strip is cross-cut to form a plurality of heat sink lids. For example, with reference to FIG. 28, cross-cutter 2804 receives heat sink lid strip 2810. Cross-cutter 2804 cuts heat sink lid strip 2810 into a plurality of separate heat sink lids 2812. For example, cross-cutter 2804 may include one or more cutting blades (e.g., saw blades) that cut across a width of heat sink lid strip 2810 to form individual heat sink lids, such as heat sink lid 504 shown in FIG. 5. Furthermore, in an embodiment, cross-cutter 2804 may include one or more additional cutting blades that cut slots in a surface of heat sink lid strip 2810 (but do not cut all the way through heat sink lid strip 2810) to form cross-cuts in the resulting individual heat sink lids (e.g., to create rows of fins). Still further, in an embodiment, cross-cutter 2804 may include one or more blades (e.g., saw blades, milling blades, etc.) that may be used to cut supporting portions extending along a length of heat sink lid strip 2810 into separate supporting portions, such as posts or stubs.

Note that system 2800 of FIG. 28 and flowchart 2900 of FIG. 29 are provided for illustrative purposes, and heat sink lid embodiments may be formed according to alternative systems and processes, including using a molding system/process, a stamping system/process, etc.

Figure 31:
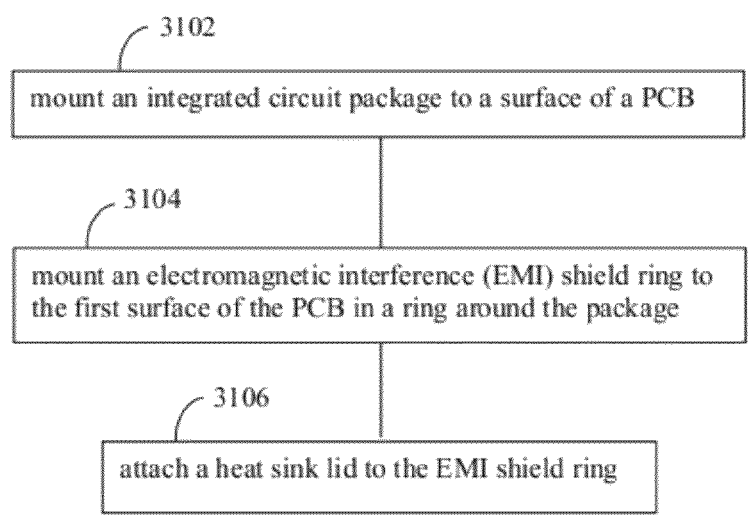
FIG. 31 shows a flowchart providing a process for forming printed circuit board assemblies, according to an example embodiment.

FIG. 31 shows a flowchart 3100 providing a process for forming printed circuit board assemblies, according to an example embodiment. Note that the steps of flowchart 3100 do not necessarily need to be performed in the order shown. Flowchart 3100 is described as follows.

Flowchart 3100 begins with step 3102. In step 3102, an integrated circuit package is mounted to a surface of a PCB. For example, as shown in FIG. 5, package 106 may be mounted to surface 110 of PCB 108. For example, package 106 may be applied to surface 110 by a pick-and-place machine or other mechanism used to mount packages 106. EMI shield rings to surfaces In embodiments, package 106 may be attached to surface 110 using an adhesive material, by reflowing solder (e.g., reflowing solder balls), by inserting pins of package 106 into surface 110, and/or according to other package mounting techniques.

In step 3104, an electromagnetic interference (EMI) shield ring is mounted to the first surface of the PCB in a ring around the package. For example, as shown in FIG. 5, EMI shield ring 502 is mounted to surface 110 of PCB 108 in a ring around package 106. For example, EMI shield ring 502 may be applied to surface 110 by a pick-and-place machine or other mechanism used to mount EMI shield rings to surfaces. An adhesive material may be applied to the PCB 108 and/or EMI shield ring 502 to attach EMI shield ring 502 to PCB 108.

Note that EMI shield rings may be formed in any manner. For example, in one embodiment, EMI shield ring 502 may be formed in a mold according to a molding process. In another embodiment, a strip of metal may be cut into separate strips, and each separate strip may be bent/folded into a ring shape to form a corresponding EMI shield ring. Protruding features and/or indented features may be formed in each EMI shield ring by the mold, by stamping them into the separate metal strips prior to folding, or in other manner.

In step 3106, a heat sink lid is attached to the EMI shield ring. As described above, extrusion press 2802 may extrude stock material 2808 to form heat sink lid strip 2810, according to step 2902 of flowchart 2900 (FIG. 29). Cross-cutter 2804 may receive heat sink lid strip 2810, and cut heat sink lid strip 2810 into a plurality of separate heat sink lids 2812, according to step 2904 of flowchart 2900. Alternatively, heat sink lids 2812 may be formed in other ways. Referring to FIG. 5, a pick-and-place machine or other mechanism may attach heat sink lid 504 to EMI shield ring 502.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An assembly, comprising:
an electromagnetic interference (EMI) shield ring configured to be mounted to a first surface of a printed circuit board (PCB) in a ring around an integrated circuit package having opposing first and second surfaces, wherein the first surface of the package is configured to be mounted directly to the first surface of the PCB;
a heat sink lid having opposing first and second surfaces, wherein the first surface of the heat sink lid includes a recessed region extending along a length of the heat sink lid, wherein the heat sink lid further includes first and second supporting portions separated by the recessed region and a plurality of fins extending from the second surface of the heat sink lid;
wherein the heat sink lid is mated with the EMI shield ring such that an enclosure is formed by the EMI shield ring and the heat sink lid that is configured to enclose the integrated circuit package, and the second surface of the package is enabled to be interfaced with a surface of the recessed region.

2. The assembly of claim 1, wherein opposing outer surfaces of the EMI shield ring include indented features, and opposing surfaces of the first and second supporting portions in the recessed region include protruding features; and
wherein the indented features interlock with the protruding features to attach the heat sink lid to the EMI shield ring.

3. The assembly of claim 1, wherein opposing outer surfaces of the EMI shield ring include protruding features, and opposing surfaces of the first and second supporting portions in the recessed region include indented features; and
wherein the protruding features interlock with the indented features to attach the heat sink lid to the EMI shield ring.

4. The assembly of claim 3, wherein a first outer surface of the EMI shield ring includes a first protruding feature, and a second outer surface of the EMI shield ring includes a second protruding feature; and
wherein the first and second protruding features are circular bumps.

5. The assembly of claim 3, wherein a first outer surface of the EMI shield ring includes a first protruding feature, and a second outer surface of the EMI shield ring includes a second protruding feature; and
wherein the first and second protruding features are ridges that respectively extend a length of the first and second outer surfaces.

6. The assembly of claim 3, where a surface of the first supporting portion in the recessed region includes a first indented feature, and a surface of the second supporting portion in the recessed region includes a second indented feature;
wherein the first and second indented features are circular dimples.

7. The assembly of claim 3, where a surface of the first supporting portion in the recessed region includes a first indented feature, and a surface of the second supporting portion in the recessed region includes a second indented feature;
wherein the first and second indented features are trenches that respectively extend a length of the surfaces of the first and second supporting portions.

8. The assembly of claim 7, wherein the trenches each have a circular cross-section.

9. The assembly of claim 7, wherein the trenches each have a triangular cross-section.

10. The assembly of claim 1, further comprising:
a gap pad that interfaces the second surface of the package with the surface of the recessed region.

11. The assembly of claim 1, further comprising:
a thermal epoxy that attaches the second surface of the package to the surface of the recessed region.

12. A method for assembling integrated circuit packages, comprising:
mounting an integrated circuit package directly to a first surface of a printed circuit board (PCB) having opposing first and second surfaces;
mounting an electromagnetic interference (EMI) shield ring to the first surface of the PCB in a ring around the package; and
attaching a heat sink lid to the EMI shield ring, the heat sink lid having opposing first and second surfaces, wherein the first surface of the heat sink lid includes a recessed region extending along a length of the heat sink lid, wherein the heat sink lid further includes first and second supporting portions separated by the recessed region and a plurality of fins extending from the second surface of the heat sink lid, the heat sink lid being mated with the EMI shield ring such that the package is positioned in an enclosure formed by the EMI shield ring and the heat sink lid, and the second surface of the package is interfaced with a surface of the recessed region.

13. The method of claim 12, wherein the heat sink lid is produced by:
extruding a stock material through an extrusion die to form a heat sink lid strip having a cross-section defined by the extrusion die; and
cross-cutting the heat sink lid strip to separate the heat sink lid strip into a plurality of heat sink lids that includes the heat sink lid.

14. The method of claim 13, wherein said extruding comprises:
forming a recessed region extending along a length of the heat sink lid strip; and
forming a protruding ridge on opposing sides of the recessed region extending along a length of the heat sink lid strip.

15. The method of claim 13, wherein said extruding comprises:
forming a recessed region extending along a length of the heat sink lid strip; and
forming indented trenches on opposing sides of the recessed region extending along a length of the heat sink lid strip.

16. The method of claim 15, wherein opposing outer surfaces of the EMI shield ring include protruding features, wherein said attaching comprises:

interlocking the protruding features with the indented trenches of the heat sink lid to attach the heat sink lid to the EMI shield ring.

17. The method of claim 16, wherein a first outer surface of the EMI shield ring includes a first protruding feature, a second outer surface of the EMI shield ring includes a second protruding feature, and the first and second protruding features are circular bumps, wherein said interlocking comprises:

interlocking the circular bumps with the indented trenches of the heat sink lid to attach the heat sink lid to the EMI shield ring.

18. The method of claim 16, wherein a first outer surface of the EMI shield ring includes a first protruding feature, a second outer surface of the EMI shield ring includes a second protruding feature, and the first and second protruding features are ridges, wherein said interlocking comprises:

interlocking the ridges with the indented trenches of the heat sink lid to attach the heat sink lid to the EMI shield ring.

19. An assembly produced according to the process of claim 12.

* * * * *